United States Patent

[11] 3,593,06

[72] Inventor Laurence L. Rosier
Champaign, Ill.
[21] Appl. No. 688,488
[22] Filed Dec. 6, 1967
[45] Patented July 13, 1971
[73] Assignee International Business Machines Corporation
Armonk, N.Y.

[54] BUS BAR TRANSISTOR AND METHOD OF MAKING SAME
32 Claims, 5 Drawing Figs.

[52] U.S. Cl. .................... 317/234,
317/234 M, 317/234 N, 317/235 Z, 29/589
[51] Int. Cl. .................... H011 5/02,
H011 7/60
[50] Field of Search .................... 317/234,
235; 29/588, 589, 577

[56] References Cited
UNITED STATES PATENTS

| | | | |
|---|---|---|---|
| 3,063,129 | 11/1962 | Thomas, Jr. | 29/25.3 |
| 3,355,636 | 11/1967 | Becke et al. | 317/234 |
| 3,381,183 | 4/1968 | Turner et al. | 317/234 |
| 3,457,631 | 7/1969 | Hall et al. | 29/57 |

*Primary Examiner*—John W. Huckert
*Assistant Examiner*—E. Wojciechowicz
*Attorneys*—Hanifin and Clark and George O. Saile

ABSTRACT: A transistor has its emitter formed as paralle strips in the surface of the body of the base with a first level o electrical contact for the emitter comprising parallel elon gated members connected to each of the strips. The first leve of electrical contact for the base comprises parallel elongate members extending parallel to each of the emitter elongate members and disposed between the emitter elongated mem bers and on the outer sides of the two outermost emitter elon gated members. The first level of electrical contact for the base also includes a rectangular shaped member, which con tacts the ends of all of the base elongated members and the sides of the two outermost base elongated members. An elec trical insulating layer is disposed over the first level of contacts and has holes therein to permit each of the emitter elongated members to be connected to a bus bar on a second level. Each of the sides of the rectangular shaped member is connected through holes in the insulating layer to a bus bar that forms a second level base contact.

Figure 1:
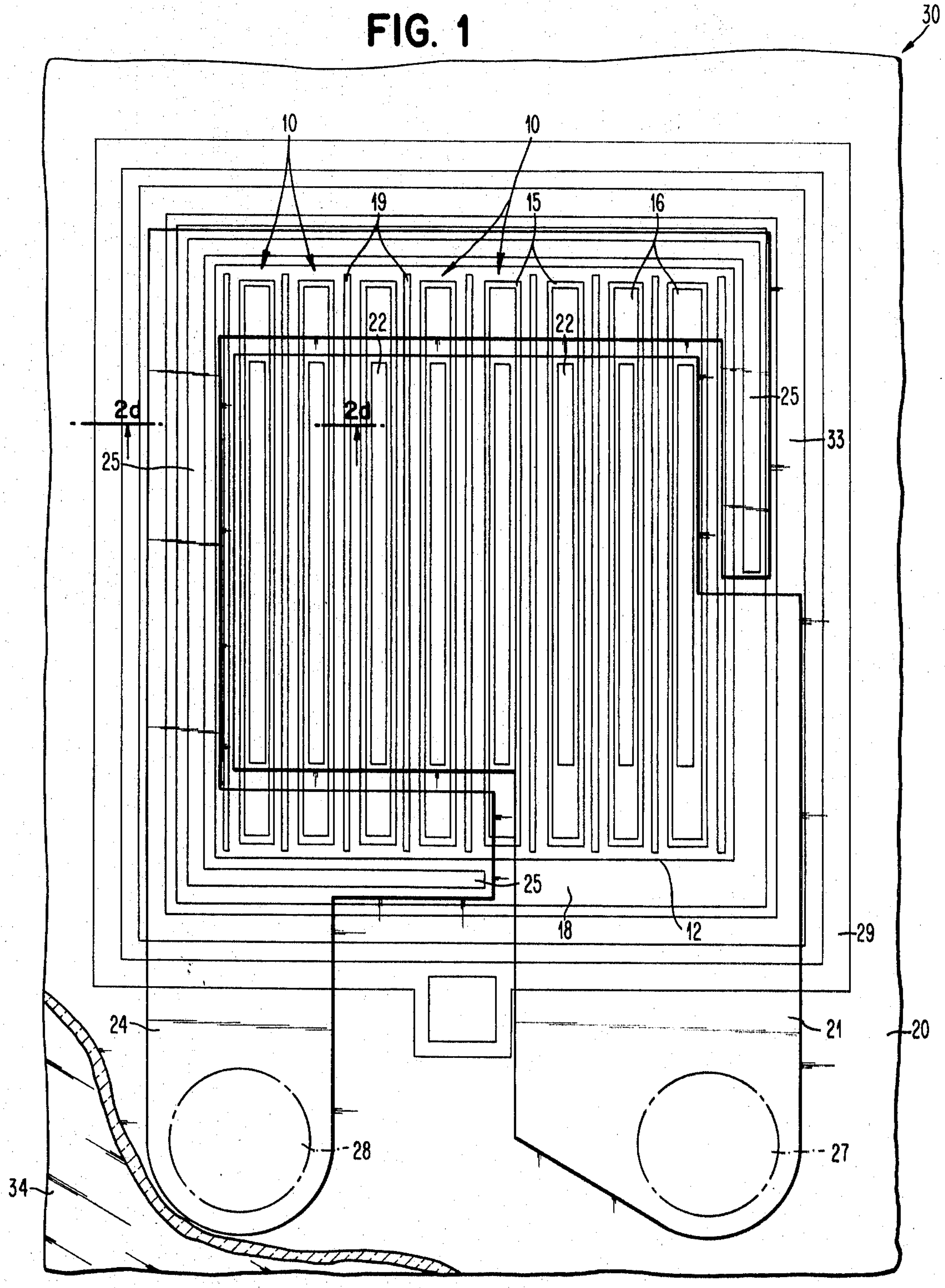

INVENTOR
LAURENCE L. ROSIER

BY

ATTORNEY

BUS BAR TRANSISTOR AND METHOD OF MAKING SAME

An efficient high current transistor requires that the collector-base area be as small as possible to minimize collector capacitance. A high current transistor also should have a substantially uniform emitter current density.

The geometry of the emitter should be long and narrow to obtain a substantially uniform emitter current density. In an effort to obtain this type of emitter geometry along with having a collector-base area as small as possible, it has been previously suggested to form a transistor having closely spaced interleaved base and emitter structures with contacts of the same configuration ohmically connected thereto.

In such an arrangement, all of the emitter contacts have been connected together along one side of the transistor and all of the base contacts have been connected together on the opposite side of the transistor. Thus, in order to have current flow throughout the emitter structure in this arrangement, it has been necessary to form a metallic conductor along the entire length of each of the leaves or strips of the emitter.

The flow of electric current through the entire length of each of these leaves or strips results in an appreciable voltage drop therealong at current levels of an ampere, for example. Thus, in the interleaved arrangement, the flow of current parallel to the length of the emitter strips or leaves has resulted in an appreciable voltage drop along the metallic conductors.

While reduction in the width of each of the emitters would provide a more uniform current density in the width direction of each emitter, this decrease in width of the emitter has the result of substantially increasing the emitter resistance thereby decreasing the emitter current density along the length of the emitter. This is because the emitter current density along the length of the emitter varies as the exponential of a junction potential, which decreases due to current flowing through the emitter and base resistances. Since the resistance of the emitter is directly proportional to its length and indirectly proportional to its width, any decrease in the width of the emitter results in an increase in the emitter resistance thereby increasing the nonuniformity of the emitter current density along the emitter length.

Accordingly, the previously suggested interleaved emitter and base contact arrangement has not produced the desired uniform emitter current density. As a result, the current gain of the transistor has been reduced. Furthermore, the emitter has not been capable of being reduced in width to that desired to produce a substantially uniform emitter current density in the width direction because of the effect on the emitter current density in the longitudinal direction.

The present invention satisfactorily solves the foregoing problem by providing a transistor structure in which current transfer to the emitter is in a direction substantially perpendicular to the emitter rather than along its length. This permits the width of the emitter to be substantially reduced to obtain a more uniform emitter current density in the direction of the emitter width without affecting the current density along the length of the emitter. Furthermore, the present invention permits the contact to be made along only the central portion of the length of the emitter whereby a more substantially uniform current density is obtained in the longitudinal direction and a much smaller voltage drop occurs in the conductor due to its relatively short length.

In the previously suggested transistors utilizing the interleaved base and emitter contact arrangement, incorporating an extended base contact or other feature for reliability purposes results in increases in base and/or emitter areas. This results in increased emitter and collector capacitances, decreases in the cutoff frequency of the transistor, and slower switching speed. The space requirements of several conventional contacting techniques result in similar area increases and performance degradation.

The present invention satisfactorily overcomes the foregc ing problems by permitting a relatively small collector-bas area since a substantially large contact area for both th emitter and the base is obtained without requiring any addi tional base area. The present invention accomplishes this b utilizing two levels of contact metallization. Thus, with the tw levels of contact metallization, separate bus bars may be em ployed for each of the emitter and the base.

With the present invention, the overall distribution of th emitter current is more uniform for a given width of th emitter than in the previously suggested transistor structur utilizing interleaved base and emitter contacts. Furthermore the width of the emitter may be substantially reduced withou creating the same poor current density distribution and volt age drop as occurs in an emitter contact in which the curren is conducted parallel to the length of the emitter.

In the previously suggested interleaved emitter and bas contact arrangement, the terminal metallurgic contacts were rather limited as to their positions because the emitter anc base contact structures were on opposite sides of the transistor. The present invention satisfactorily solves thi problem by permitting a relatively flexible selection of loca tion of the terminal metallurgic contacts for both the emitte and base.

In high voltage transistors, it is desired to have an extended base contact. In the previously suggested transistor having an interleaved base and emitter contact arrangement, this encompassing type of base contact was not possible because the emitter contact structure extended from one side of the transistor.

The present invention satisfactorily solves the foregoing problem by permitting an extended base contact in the lower level of contact metallization without any interference by the emitter contact. Thus, the transistor of the present invention also is useful as high voltage transistor.

An object of this invention is to provide a transistor having two levels of contact metallization and a method of forming the same. Another object of this invention is to provide a transistor having a substantially uniform emitter current density.

A further object of this invention is to provide a transistor having relatively flexible terminal metallurgic contact locations for the emitter and base contacts.

Still another object of the invention is to provide a transistor having emitter fingers of relatively small width.

The foregoing and other objects, features and advantages of this invention will be apparent from the following more particular description of a preferred embodiment of the invention, as illustrated in the accompanying drawings.

In the drawings:

FIG. 1 is an enlarged top plan view of a transistor having the contact arrangement of the present invention.

FIGS. 2*a* to 2*d* are schematic views illustrating certain steps in a method of forming the transistor of the present invention.

Referring to the drawings and particularly FIG. 1, there is shown a transistor 10 of the NPN type. It should be understood that the transistor 10 could be of the PNP type if desired.

Figures 2A, 2B, 2C, 2D:
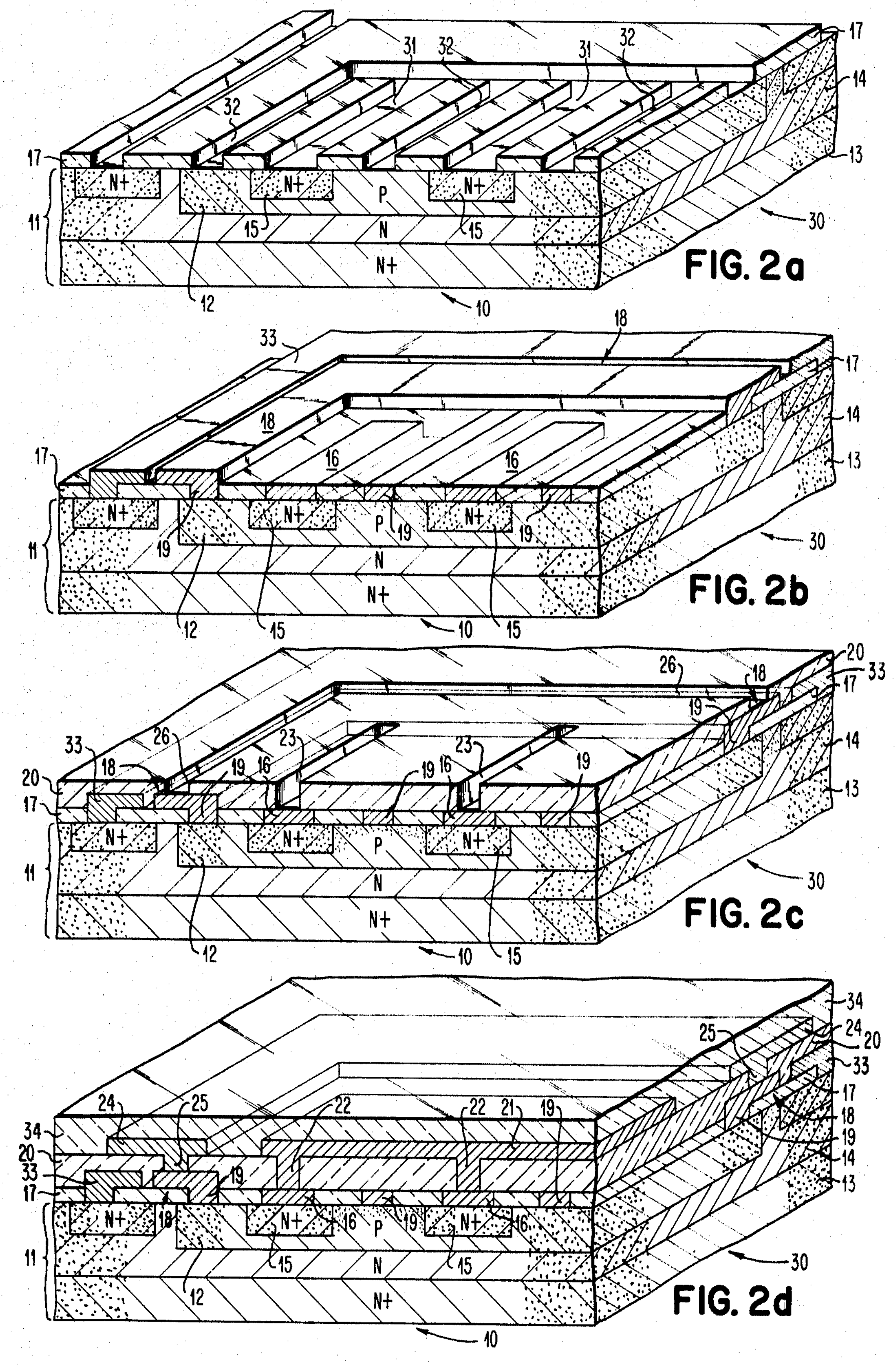

As shown in FIG. 2*d*, the transistor 10 includes a collector 11 and a base 12 of P-type conductivity. The collector 11 includes an area 13 of N+ conductivity and an intrinsic area 14 of N-type conductivity disposed between the base 12 and the area 13. The transistor 10 has emitter strips 15, which are parallel to each other of N+ conductivity, formed in the body of the base 12 at its surface.

It should be understood that the various portions of the transistor 10 and its contact elements do not actually appear in FIG. 1 but they have caused portions of the top insulating layer of the transistor 10 to be pushed upwardly whereby they may be identified in FIG. 1 as to their relationship to each other. Accordingly, various elements have been identified by appropriate numerals in FIG. 1 to indicate their relationship to each other.

Each of the emitter strips 15 has an elongated member 16 of ›ctrically conductive material such as aluminum, for exam- ›, ohmically connected thereto and extending for substan- .lly the entire length of the emitter strip 15. The elongated ›mbers 16, which function as spaced electrical contacts for › emitter strips 15 and are parallel to each other, are electri- lly insulated from each other by a first layer 17 (see FIG. ) of a suitable insulating material such as silicon dioxide, for ample.

The electrical contact means to the base 12 is interposed in › spaces between the emitter strips 15 and surrounds the iitter strips 15. The electrical contact means includes a plu- ity of elongated members or fingers 19 disposed in the ıces between the strips 15 and on each side of the outermost the strips 15. The electrical contact means also includes a :tangular shaped member 18 having two parallel sides con- :ting the opposite ends of the members 19. The other two es of the member 18 contact the outer sides of the members that are disposed on each side of the outermost of the strips .

The member 18 is formed integral with the elongated mem- rs 19, and they are formed of electrically conductive materi- such as aluminum, for example. The electrical contact :ans to the base 12 is ohmically connected to the surface of : body of the base 12 through the layer 17 of insulating ıterial only by the members 19. The member 18 is disposed ɔve the layer 17 of insulating material as shown in FIG. 2*b*.

The transistor 10 has a second layer 20 (see FIG. 2*c*) of ctrically insulating material such as silicon dioxide, for ex- ple, disposed over the first layer 17 of insulating material, : elongated members 16, the rectangular shaped member , and the elongated members 19. A bus bar 21 of an electri- ly conductive material such as aluminum, for example, is mically connected through the second layer 20 of insulating .terial to the central portion of each of the elongated mem- :s 16. Thus, the bus bar 21 has portions 22 (see FIG. 2*d*) ex- ıding downwardly through holes or openings 23 (see FIG. ı in the layer 20 of insulating material to make ohmic con- t only with the central portion of the length of each of the ngated members 16.

\ bus bar 24 of an electrically conductive material such as minum, for example, is disposed in partial surrounding ation to the bus bar 21. The bus bar 24, which serves the ›e bus bar, has portions 25 (see FIG. 2*d*) extending ›wnwardly through openings or holes 26 (see FIG. 2*c*) in the ond layer 20 of the insulating material to ohmically contact ·tions of the rectangular shaped member 18.

\s shown in FIG. 2*d*, the rectangular shaped member 18 is posed over the layer 17 of insulating material and overlaps collector-base junction, which is formed by the base 12 l the intrinsic area 14 of the collector 11. The openings or es 26 are disposed outside the base 12 and are so formed t the bus bar 24 makes contact completely along two ad- ent sides of the rectangular shaped member 18 and along ·ts of the other two sides thereof. With the rectangular .ped member 18 formed so that a portion extends beyond collector-base junction, this extending portion is disposed .side the active area of the transistor 10. The disposition of rectangular shaped member 18 over the layer 17 of insu- ng material forms an extended base contact.

\s shown in FIG. 1, the bus bar 21 has a terminal metallur- contact 27. The bus bar 24 has a similar terminal metallur- contact 28. Each of the contacts 27 and 28 may be ohmi- ly connected to any portion of the bus bars 21 and 24, pectively. It should be understood that the arrangement of terminal contacts 27 and 28 and the bus bars 21 and 24 is npletely arbitrary and need not be as shown in FIG. 1.

\ guard ring 29 surrounds the base 12 of the transistor 10 to ibit the spread of an inversion layer on the surface of the ısistor 10. The guard ring 29 is formed in the surface of a :er 30 having a plurality of the transistors 10 formed therein h each of the transistors 10 having one of the guard rings In one method of forming the bus bar transistor 10 of the present invention, the starting substrate wafer 30 has an N+ conductivity formed by doping with antimony, for example. The area 14 is formed on the wafer 30 through depositing an N-type epitaxial layer doped with phosphorous, for example, on the wafer 30.

The wafer 30 is then thermally oxidized to form a layer of insulating material across the entire surface of the area 14. Then, holes are etched in the oxide layer to conform to the base diffusion pattern to form a plurality of the bases 12 on top of the area 14. This diffusion pattern creates a plurality of the transistors 10 on the wafer 30. The bases 12 are formed by diffusion a P-type impurity such as boron, for example, with a concentration of $10^{18}$to $10^{19}$atoms/cm.$^3$ through the holes formed in the oxide.

Gold may then be evaporated onto the side of the wafer 30 opposite the bases 12. Subsequent high temperature diffusion and oxidation steps will diffuse this gold into the wafer 30 and redistribute it to control lifetime and convert the epitaxial layer, which forms the area 14, to intrinsic concentration.

Then, the wafer 30 is again thermally oxidized to form another oxide layer thereon. Holes are again etched in this oxide layer to conform to the pattern of the emitter strips 15 and the guard ring 29 for each of the transistors 10. Then, and N-type impurity such as a high concentration of phosphorous (a concentration of $10^{21}$ atoms/cm.$^3$, for example,) is diffused through the appropriate holes in the oxide layer. The guard ring 29 is formed at the same time.

The wafer 30 is again thermally oxidized and/or a layer of electrically insulating material such as silicon dioxide, for example, is deposited on the transistor 10 over the entire surface of the base 12, the emitter strips 15, and the guard ring 29 to form the first insulating layer 17. Then, holes 31 and 32 are etched in the first layer 17 of the insulating material by suitable means such as photoresist, for example, as shown in FIG. 2*a* for a portion of one of the transistors 10.

The holes or openings 31 are formed in the layer 17 of the insulating material so as to not extend beyond the width or length of each of the emitter strips 15. However, the holes 31 extend for substantially the entire length and the entire width of the emitter strips 15. The holes or openings 32, which are preferably formed at the same time as the holes 31 and have a smaller width than the holes 31, provide communication through the layer 17 to the surface of the body of the base 12 in the areas between each of the emitter strips 15 and in an area on each side of the outermost of the emitter strips 15.

Thereafter, a suitable layer of metal such as aluminum, for example, is deposited through the holes 31 and 32 in the first layer 17 of the insulating material to provide an ohmic contact with the base 12 and the emitter strips 15. The metal may be deposited through the holes 31 and 32 by any suitable means such as evaporation, sputtering, or pyrolytic decomposition, for example. The thickness of the layer of metal is approximately 0.6 micron.

After the layer of metal has been deposited through the holes 31 and 32, separate emitter and base lands must be formed for contact only with the emitter strips 15 and the base 12. The emitter lands are the elongated members 16 while the base lands are the rectangular shaped member 18 and the elongated members 19 shown in FIG. 2*b*. This is accomplished by any suitable photoresist and etching technique.

As previously mentioned, the member 18 is disposed above the layer 17 and only the elongated members 19 make contact through the holes 32 to the base 12. At the time of forming the emitter and base lands of the first level of contact to the base 12 and the emitter strips 15, a field relief electrode 33 is formed from the deposited metal.

While the rectangular-shaped member 18 is disposed slightly above the plane of the members 19 and the members 16, the electrical contact means is connected to the base 12 in substantially the same plane as the members 16 are connected to the emitter strips 15. This is because contact is made only through the members 19 to the base 12.

Then, the second layer 20 of the electrical insulating material is deposited over the elongated members 16, the rectangular shaped member 18, the elongated members 19, and the remainder of the first layer 17 of the electrically insulating material. The second layer 20 of the electrical insulating material may be sputtered silicon dioxide, for example, and have a thickness of 1.6 microns.

Thereafter, by suitable means such as photoresist, the holes 23 and the holes 26 are etched, preferably simultaneously, in the second layer 20 of the insulating material as shown in FIG. 2*c*. The holes 23 are formed to extend for a substantial portion of the length of each of the elongated members 16 and for a portion of the width thereof. The holes 26 are formed, as previously mentioned, to insure that at least part of each of the sides of the rectangular-shaped member 18 is exposed through the second layer 20 of the insulating material.

The holes 26 are disposed exterior of the collector-base junction, which is defined by the base 12 and the intrinsic area 14 of the collector 11. As shown in FIG. 1 wherein the portions 25 of the bus bar 24 are identified since the portions 25 fill the holes 26, the holes 26 extend completely along the left and top sides of the transistor 10 and along parts of the other two sides. The holes 26 are vertically aligned with the rectangular-shaped member 18.

A layer of metal such as aluminum, for example, is next deposited on the second layer 20 of the insulating material and within the holes 23 and 26. This layer of metal has a thickness of 1 micron or more. The emitter and base areas or lands of this second level of ohmic contact are formed through any suitable photoresist and etching techniques in the same manner as the emitter and base lands of the first level of contact.

Thus, the metal, which is formed in the holes 23, becomes the contact portions 22 for the bus bar 21 and makes contact with the elongated members 16. Similarly, the metal, which is deposited within the holes 26, becomes the contact portions 25 for the bus bar 24 with the rectangular-shaped member 18 and the elongated members 19.

A third layer 34 of electrically insulating material such as sputtered silicon dioxide, for example, is next deposited over the transistor 10 as shown in FIG. 2*d*. The third layer 34 of electrically insulating material has a thickness of approximately 2 microns or more.

Next, a layer of metal such as chrome-copper-gold, for example, is deposited on the side of the wafer 30 away from the third layer 34 of electrically insulating material. This forms the ohmic contact for the collector 11.

Holes are then formed in the layer 34 of insulating material to permit connection of the terminal contact 27 to the bus bar 21 and the terminal contact 28 to the bus bar 24. These terminal holes are formed in the layer 34 of the insulating material by suitable etching means such as the photoresist technique, for example.

A metal mask is next employed to have a multilayer structure deposited therethrough to form the terminal contacts 27 and 28. The multilayer structure may be chrome-copper-gold or chrome-nickel-gold as the first layer with tin-lead solder being the second layer and a nickel-clad copper ball forming the third layer. It is necessary to melt the solder in the second layer for reflow with the nickel-clad copper ball when the nickel-clad copper ball is added. The chrome is disposed next to the bus bar 21 or 24.

It should be understood that the various transistors 10 are separated from each other by cutting the wafer 30 by suitable means. Thus, the collectors 11 are separated as the various transistors 10 are separated from each other at this time.

While the member 18 has been shown as rectangular-shaped, it should be understood that it may have any other shape as long as long as it surrounds the emitter strips 15 and contacts the surface of the body of the base 12. It should be understood that the shape of the member 18 is such that the collector-base area will be as small as possible so as to keep the collector capacitance to a minimum and still permit the emitter strips 15 to have their desired geometry.

An advantage of this invention is that it minimizes collect capacitance by permitting use of relatively small collecto base areas in high current transistors or the like while obtai ing large emitter and base contact areas. Another advanta of this invention is that it allows a relatively small width of th emitter finger to be used without the problem of curre crowding, which is created by nonuniform emitter curre density. A further advantage of this invention is that it is qui flexible as to the location of the terminal metallurgic contact Still another advantage of this invention is that it distribut emitter current uniformly to all portions of the emitter are without the nonuniformities and voltage drops encountered i more conventional structures.

While the invention has been particularly shown an described with reference to a preferred embodiment thereo it will be understood by those skilled in the art that variou changes in form and details may be made therein without de parting from the spirit and scope of the invention.

What I claim is:

1. Conducting means for making electrical contact to semiconductor body at a first region of one conductivity typ and a second region of another conductivity type comprising:

first contact means of electrically conductive materia adapted to be connected to the first region;

second contact means of electrically conductive materia adapted to be connected to the second region;

said second contact means being connected to the secon region in substantially the same plane as said first contac means is connected to the first region;

said second contact means being electrically insulated fron said first contact means;

electrical insulating means disposed over said first contac means and said second contact means;

third contact means of electrically conductive materia disposed exterior of said insulating means and electricall connected through said insulating means to said first con tact means to form a second level of electrical contact fo the first region;

and fourth contact means of electrically conductive materi al disposed exterior of said insulating means and electri cally connected to said second contact means through said insulating means to form a second level of electrica contact for the second region;

said fourth contact means being electrically insulated from said third contact means.

2. The conducting means according to claim 1 in which:

said first contact means comprises a plurality of elongated members disposed substantially parallel to each other;

and said insulating means has openings therein to permit said third contact means to contact each of said elongated members.

3. The conducting means according to claim 1 in which:

said second contact means substantially surrounds and is interposed between said first contact means;

and said insulating means has openings therein to permit said fourth contact means to engage portions of said second contact means.

4. The conducting means according to claim 2 in which:

said second contact means comprises:

elongated members disposed between said elongated members of said first contact means and substantially parallel to said elongated members of said first contact means;

and means surrounding said elongated members of said first contact means and said elongated members of said second contact means, said surrounding means being connected to the ends of said elongated members of said second contact means;

and said insulating means has openings therein to permit said fourth contact means to engage said surrounding means.

5. Conducting means for making electrical contact to a semiconductor body at a first region of one conductivity type and a second region of another conductivity type comprising:

first contact means comprising a plurality of spaced contact members of electrically conductive material adapted to ohmically contact the first region;

second contact means electrically insulated from said first contact means and adapted to ohmically contact the second region, said second contact means comprising:

a plurality of spaced contact members of electrically conductive material disposed between said spaced contact members of said first contact means;

and means surrounding said spaced contact members of said first contact means and connected to each end of said spaced contact members of said second contact means;

third contact means of electrically conductive material ohmically connected to each of said spaced contact members of said first contact means and electrically insulated from said second contact means;

and fourth contact means of electrically conductive material ohmically connected to said second contact means and electrically insulated from said first contact means and said third contact means.

6. The conducting means according to claim 5 in which ch of said spaced contact members of said first contact :ans comprises an elongated member.

7. The conducting means according to claim 6 in which said ›ngated members are substantially parallel to each other.

8. The conducting means according to claim 7 in which:

each of said spaced contact members of said second contact means is an elongated member;

and said elongated members of said second contact means are disposed substantially parallel to each other and to said elongated members of said first contact means.

9. The conducting means according to claim 8 in which said :rounding means of said contact means has the shape of a ht-angled parallelogram.

10. A semiconductor structure comprising;

a semiconductor body having a surface of one conductivity type;

a plurality of spaced strips of another conductivity type formed in said surface;

a first group of elongated members of electrically conductive material with each of said elongated members ohmically connected to one of said strips;

second means of electrically conductive material ohmically connected to said surface of said body, said second means surrounding and extending between said strips;

first electrical insulating means to insulate said first group of elongated members from said second means;

second electrical insulating means disposed over said first group of said elongated members and said second means;

first electrically conducting means disposed exteriorly of said second insulating means and ohmically connected through said second insulating means to each of said elongated members of said first group;

and second electrically conducting means disposed exteriorly of said second insulating means and ohmically connected to said second means.

11. The semiconductor structure according to claim 10 in ich:

said second means of electrically conductive material comprises:

a second group of elongated members extending between said strips;

and means surrounding said elongated members of said second group and connected to each end of each of said elongated members of said second group;

and said second electrically conductive means is ohmically connected to said surrounding means.

12. The semiconductor structure according to claim 11 in ich:

said spaced strips are substantially parallel to each other;

said elongated members of said first group are substantially parallel to each other;

and said elongated members of said second group are substantially parallel to each other and to said elongated members of said first group.

13. A method for forming electrical contacts for a semiconductor device having a semiconductor body of one conductivity type and strips of a second conductivity type formed in the surface of the body, said method comprising:

coating the surface of the body and the strips with a first layer of electrical insulating material;

forming first openings in the insulating material for communication with each of the strips separately;

forming second openings in the insulating material for communication with the body in areas spaced from the strips;

placing electrically conductive material in communication with each of the strips through the first openings in the insulating material to form spaced electrical contacts;

placing electrically conductive material in communication with the body through the second openings in the insulating material to form electrical contact means;

adding a second layer of electrical insulating material over the first layer of insulating material, the spaced electrical contacts for the strips, and the electrical contact means for the body;

forming first openings in the second layer of insulating material for communication with the spaced electrical contacts;

forming second openings in the second layer of insulating material for communication with the electrical contact means of the body with the second openings in the second layer of insulating means being spaced from the first openings in the second layer of insulating means;

placing electrically conductive material in communication with the spaced electrical contacts through the first openings in the second layer of insulating material to form a second level electrical contact means for the strips;

and placing electrically conductive material in communication with the electrical contact means of the body through the second openings in the second layer of insulating material to form a second level electrical contact means for the body.

14. The method according to claim 13 including:

forming the first openings in the first layer of insulating material substantially parallel to each other;

and forming the first openings in the second layer of insulating material directly above the first openings in the first layer of insulating material and of a smaller size than the spaced electrical contacts.

15. The method according to claim 13 including forming the second openings in the first layer of insulating material both between the first openings in the first layer of insulating material and on the outer side of the two outermost of the first openings in the first layer of insulating material.

16. The method according to claim 14 including forming the second openings in the first layer of insulating material between the first openings in the first layer of insulating material and on the outer side of the two outermost of the first openings in the first layer of insulating material.

17. The method according to claim 13 in which:

all of the openings in the first layer of insulating material are formed substantially simultaneously:

and all of the openings in the second layer of insulating material are formed substantially simultaneously.

18. The method according to claim 17 in which:

all of the electrically conductive material is deposited through the openings in the first layer of insulating material substantially simultaneously;

and all of the electrically conductive material is deposited through the openings in the second layer of insulating material substantially simultaneously.

19. The conducting means according to claim 2 in which:

said third contact means comprises:

a plurality of elongated members, each of said elongated members having one surface disposed in ohmic contact with a corresponding one of said elongated members of said first contact means, each of said elongated members of said third contact means extending for only the central portion of the length of said elongated member of said first contact means with which it is in ohmic contact;

and a bus bar contacting the opposite parallel surface to said one surface of each of said elongated members of said third contact means to cause current to flow from the first region to said bus bar in a direction substantially perpendicular to each of said elongated members of said first contact means and each of said elongated members of said third contact means.

20. The conducting means according to claim 19 in which each of said elongated members of said third contact means has a width less than the width of said elongated member of said first contact means with which it is in ohmic contact.

21. The conducting means according to claim 4 in which:

said third contact means comprises:

a plurality of elongated members, each of said elongated members having one surface disposed in ohmic contact with a corresponding one of said elongated members of said first contact means, each of said elongated members of said third contact means extending for only the central portion of the length of said elongated member of said first contact means with which it is in ohmic contact;

and a bus bar contacting the opposite parallel surface to said one surface of each of said elongated members of said third contact means to cause current to flow from the first region to said bus bar in a direction substantially perpendicular to each of said elongated members of said first contact means and each of said elongated members of said third contact means;

said surrounding means of said second contact means is polygonal shaped;

and said fourth contact means comprises a bus bar engaging each of the sides of said polygonal shaped surrounding means.

22. The conducting means according to claim 21 in which each of said elongated members of said third contact means has a width less than the width of said elongated member of said first contact means with which it is in ohmic contact.

23. The conducting means according to claim 6 in which:

said third contact means comprises:

a plurality of elongated members, each of said elongated members having one surface disposed in ohmic contact with a corresponding one of said elongated members of said first contact means, each of said elongated members of said third contact means extending for only the central portion of the length of said elongated member of said first contact means with which it is in ohmic contact;

and a bus bar contacting the opposite parallel surface to said one surface of each of said elongated members of said third contact means to cause current to flow from the first region to said bus bar in a direction substantially perpendicular to each of said elongated members of said first contact means and each of said elongated members of said third contact means.

24. The conducting means according to claim 23 in which each of said elongated members of said third contact means has a width less than the width of said elongated member of said first contact means with which it is in ohmic contact.

25. The conducting means according to claim 9 in which:

said third contact means comprises:

a plurality of elongated members, each of said elongated members having one surface disposed in ohmic contact with a corresponding one of said elongated members of said first contact means, each of said elongated members of said third contact means extending for only the central portion of the length of said elongated member of said first contact means with which it is in ohmic contact;

and a bus bar contacting the opposite parallel surface to said one surface of each of said elongated members of said third contact means to cause current to flow from the first region to said bus bar in a direction substantially perpendicular to each of said elongated members of said first contact means and each of said elongated members of said third contact means;

and said fourth contact means comprises a bus bar engaging each of the sides of said surrounding means.

26. The conducting means according to claim 25 in which each of said elongated members of said third contact means has a width less than the width of said elongated member of said first contact means with which it is in ohmic contact.

27. The semiconductor structure according to claim 10 in which:

said first electrically conducting means comprises:

a plurality of elongated members, each of said elongated members having one surface disposed in ohmic contact with a corresponding one of said elongated members of said first group, each of said elongated members of said first electrically conducting means extending for only the central portion of the length of said elongated member of said first group with which it is in ohmic contact;

and a bus bar contacting the opposite parallel surface to said one surface of each of said elongated members of said first electrically conducting means to cause current to flow from each of said strips to said bus bar in a direction substantially perpendicular to each of said strips.

28. The semiconductor structure according to claim 27 in which each of said elongated members of said first electrically conducting means has a width less than the width of said elongated member of said first group with which it is in ohmic contact.

29. The semiconductor structure according to claim 12 in which:

said first electrically conducting means comprises:

a plurality of elongated members, each of said elongated members having one surface disposed in ohmic contact with a corresponding one of said elongated members of said first group, each of said elongated members of said first electrically conducting means extending for only the central portion of the length of said elongated member of said first group with which it is in ohmic contact;

and a bus bar contacting the opposite parallel surface to said one surface of each of said elongated members of said first electrically conducting means to cause current to flow from each of said strips to said bus bar in a direction substantially perpendicular to each of said strips;

said surrounding means of said second means of electrically conductive material being polygonal shaped;

and said second electrically conducting means comprises a bus bar engaging each of the sides of said polygonal shaped surrounding means.

30. The semiconductor structure according to claim 29 in which each of said elongated members of said first electrically conducting means has a width less than the width of said elongated member of said first group with which it is in ohmic contact.

31. A transistor comprising:

a collector;

a base;

an emitter, said emitter comprising a plurality of spaced parallel strips formed within said base;

an emitter bus bar;

and means to transfer current from each of said emitter strips to said emitter bus bar so that current flows from each of said emitter strips in a direction only substantially perpendicular to each of said emitter strips for substantially its entire length.

32. The transistor according to claim 31 in which:
said current transfer means includes:
a first group of separate elongated members, each of said elongated members being in ohmic contact with a corresponding one of said emitter strips;
and a second group of separate elongated members, each of said elongated members of said second group having one surface in ohmic contact with a corresponding one of said elongated members of said first group and its opposite parallel surface in ohmic contact with said emitter bus bar;
each of said elongated members of said second group extending for only the central portion of the length of each of said elongated members of said first group and having a width less than the width of each of said elongated members of said first group.

PO-1050
(5/69)

UNITED STATES PATENT OFFICE
CERTIFICATE OF CORRECTION

Patent No. 3,593,068 Dated July 13, 1971

Inventor(s) Laurence L. Rosier

It is certified that error appears in the above-identified patent and that said Letters Patent are hereby corrected as shown below:

| | |
|---|---|
| Column 4, Line 13 (In the Specification Page 8, Line 30) | change "diffusion" to--diffusing-- |
| Column 4, Line 25 (In the Specification Page 9, Line 11) | change "and" to--an-- |
| Column 6, Line 68 Claim 4 (In the Claims, Claim 4 Line 12) | delete "the ends" and insert--each end of each" |
| Column 7, Line 69, Claim 11 (In the Claims, Claim 11 Line 12) | change "conductive" to --conducting-- |
| Column 8, Line 10, Claim 13 (In the Claims, Claim 13 Line 9) | after "the" insert--first layer of-- |

Signed and sealed this 5th day of December 1972.

(SEAL)
Attest:

EDWARD M.FLETCHER,JR.
Attesting Officer

ROBERT GOTTSCHALK
Commissioner of Patents